(12) United States Patent
Endo

(10) Patent No.: US 9,581,663 B2
(45) Date of Patent: Feb. 28, 2017

(54) NMR SAMPLE TUBE AND NMR SPECTROMETER

(71) Applicant: JEOL Resonance Inc., Tokyo (JP)

(72) Inventor: Yuki Endo, Tokyo (JP)

(73) Assignee: JEOL Ltd., Tokyo (JP)

( * ) Notice: Subject to any disclaimer, the term of this patent is extended or adjusted under 35 U.S.C. 154(b) by 967 days.

(21) Appl. No.: 13/889,569

(22) Filed: May 8, 2013

(65) Prior Publication Data

US 2013/0307543 A1 Nov. 21, 2013

(30) Foreign Application Priority Data

May 15, 2012 (JP) .................................. 2012-111578

(51) Int. Cl.
*G01R 33/30* (2006.01)

(52) U.S. Cl.
CPC .................................. *G01R 33/307* (2013.01)

(58) Field of Classification Search
CPC .................................................... G01R 33/307
See application file for complete search history.

(56) References Cited

U.S. PATENT DOCUMENTS

| | | | | |
|---|---|---|---|---|
| 3,609,519 A * | 9/1971 | Seki | ....................... | G01R 33/46 324/310 |
| 4,456,882 A | 6/1984 | Doty | | |
| 4,511,841 A | 4/1985 | Bartuska et al. | | |
| 5,508,615 A | 4/1996 | Doty et al. | | |
| 5,598,097 A * | 1/1997 | Scholes | ................ | G01R 33/345 324/316 |
| 6,396,274 B1 * | 5/2002 | Commens | ............ | G01R 33/307 324/318 |
| 6,437,570 B2 * | 8/2002 | Marek | ..................... | G01R 33/30 324/300 |
| 6,441,617 B2 * | 8/2002 | Marek | ..................... | G01R 33/30 324/300 |
| 6,466,019 B2 * | 10/2002 | Marek | ..................... | G01R 33/30 324/318 |
| 7,164,269 B2 * | 1/2007 | Hasegawa | ........ | G01R 33/34069 324/318 |
| 7,173,424 B2 * | 2/2007 | Saitoh | .............. | G01R 33/34069 324/318 |
| 7,352,186 B2 * | 4/2008 | Hasegawa | ........ | G01R 33/34053 324/318 |
| 7,619,414 B2 * | 11/2009 | Yamamoto | ............. | G01R 33/30 324/318 |
| 7,728,593 B2 * | 6/2010 | Norell | ..................... | G01R 33/30 324/318 |
| 9,335,388 B2 * | 5/2016 | Shimada | ................ | G01R 33/30 |

FOREIGN PATENT DOCUMENTS

JP 2011227036 A 11/2011

* cited by examiner

*Primary Examiner* — Dixomara Vargas
(74) *Attorney, Agent, or Firm* — The Webb Law Firm

(57) ABSTRACT

An NMR sample tube is offered which can be spun at high speed stably. The NMR sample tube is adapted for use in solid-state NMR spectroscopy and includes a tubular member, spacers, and cover bodies. The spacers are disposed inside the tubular member. Each spacer has first and second surfaces located on opposite sides. The first surfaces of the spacers define a space filled up with a sample. The tubular member has openings which are closed off by the cover bodies.

12 Claims, 8 Drawing Sheets

NMR SAMPLE TUBE AND NMR SPECTROMETER

BACKGROUND OF THE INVENTION

Field of the Invention

The present invention relates to an NMR sample tube and NMR spectrometer.

Description of Related Art

An NMR (nuclear magnetic resonance) spectrometer is an analytical instrument for detecting a signal arising from atomic nuclei having spin magnetic moments by applying a static magnetic field to the nuclei to induce the spin magnetic moments for producing a Larmor precession and irradiating the nuclei with RF waves having the same frequency as the precession to bring the nuclei into resonance.

Samples to be investigated by NMR include two types: solution samples and solid samples. Among them, many solution samples give quite sharp NMR spectra and, therefore, it is widespread to perform molecular structural analysis of chemical substances from the obtained high-resolution NMR spectra.

On the other hand, in an NMR spectrum of a sample in solid phase, interactions (such as dipolar interactions) which would be nullified by rotational Brownian motion in a solution manifest themselves directly and so the spectral linewidth broadens extremely, thus obscuring chemical shift terms. Therefore, in an NMR spectrum, it is impossible to isolate the signal peaks arising from various portions of a molecule under investigation. As a result, it has been thought that solid-state NMR spectroscopy is unsuited for molecular structural analysis.

MAS (magic angle spinning) has attracted attention as a method of overcoming this undesirable phenomenon and giving rise to sharp solid-state NMR spectra. In particular, anisotropic interactions are removed and chemical shift terms can be extracted by tilting the sample tube at the magic angle of 54.7° to the static magnetic field and spinning the tube at high speed.

For example, JP-A-2011-227036 discloses an NMR spectrometer equipped with a sample spinner having a gas bearing that supplies gas into between a sample tube and a sample tube-holding mechanism to keep the sample tube afloat. The gas bearing permits the sample tube to be spun at high speed about an axis tilted at 54.7° to the static magnetic field.

In such an NMR spectrometer, it is generally required that the sample tube be spun at high speeds of several kilohertz to tens of kilohertz within the static magnetic field in order to perform good NMR spectroscopy of solid samples employing MAS.

To implement the MAS method, a solid sample placed within a static magnetic field must be spun at high speed. However, it is not easy to obtain rotational speeds of kilohertz to tens of kilohertz which are regarded as needed spinning speed. Accordingly, gas bearing techniques have been heretofore adopted to obtain such rotational speeds, and various methods have been proposed.

FIG. 11 shows a conventional high-speed spinner for solid-state NMR spectroscopy. The spinner includes a cylindrical stator 11 that surrounds a rotor 12 with a slight spacing therebetween. A solid sample is sealed in the rotor 12. The bottom of the cylindrical stator 11 is covered by a thrust stator 13. A thrust rotor 14 is mounted at the bottom of the rotor 12 in an opposite relation to the thrust stator 13 to maintain the position of the rotor 12 taken in the thrust direction. A turbine 16 is mounted in an upper part of the rotor 12 to impart a rotating force to the rotor 12 by gas jets ejected from turbine nozzles 15 formed in the stator 11. The rotor 12, thrust rotor 14, and turbine 16 together constitute a rotor-turbine assembly that spins at high speed.

FIG. 12 is a cross section of a conventional high-speed spinner for solid-state NMR spectroscopy, the cross section being taken along line bb of FIG. 11. As is obvious from FIG. 12, a thin layer of gas is formed between the stator 11 and the rotor 12 by continuously supplying gas from plural gas feeding holes 911 formed in the stator 11 toward the interior of the stator 11. This results in a journal gas bearing. That is, the frictional resistance between the stator 11 and the rotor 12 is reduced to a minimum. Consequently, the rotor-turbine assembly can be spun inside the stator 11 at high speed.

FIG. 13 is a cross section of the conventional high-speed spinner for solid-state NMR spectroscopy, the cross section being taken along line cc of FIG. 11. As is obvious from FIG. 13, gas jets ejected from the turbine nozzles 15 formed eccentrically relative to the stator 11 act on the blades of the turbine 16, imparting a rotating force on the rotor-turbine assembly. The gas jets acting on the turbine 16 change in orientation and form gas streams 17 shown in FIG. 11, the streams 17 being discharged out of the high-speed spinner.

Development of a high-speed spinner using such a hydrostatic bearing was commenced by Doty (U.S. Pat. No. 4,456,882). Then, Bartuska et al. (U.S. Pat. No. 4,511,841) have proposed a high-speed spinner using a combination of a hydrostatic bearing and a hydrodynamic bearing. Doty et al. (U.S. Pat. No. 5,508,615) have attempted to make improvements in the hydrostatic bearing.

It has been found that when the above-described high-speed spinner is used and the spinning rate of the sample tube is raised, if the natural vibration frequency of the sample tube comes into coincidence with the spinning speed, synchronous vibrations occur. This phenomenon is observed when a rotor-turbine assembly supported by a gas bearing is spun at high speed. Generally, the phenomenon is caused by an imbalance in the rotor-turbine assembly. If the imbalance is large, the sample tube may come into contact with the gas bearing at the resonant point that is a natural vibration frequency at which synchronous vibrations take place, thus causing seizure or damage. This makes it impossible to raise the spinning speed. This will be described in further detail below.

The resonant point of synchronous vibrations is given as follows.

In cylindrical mode, the resonant point is given by $$N_1 = \frac{1}{2\pi}\left(\frac{k}{M}\right)^{\frac{1}{2}}$$

In conical mode, the resonant point is given by $$N_2 = \frac{1}{2\pi}\left(\frac{2kJ^2}{I_t - I_0}\right)^{\frac{1}{2}}$$

where M is the mass of a rotor-turbine assembly supported by one radial bearing, k is the bearing rigidity per radial bearing, $I_t$ is the inertial moment about the center of gravity of the rotor-turbine assembly, $I_0$ is the polar inertial moment about the central line of the rotor-turbine assembly, and J is a half of the center-to-center distance of two radial bearings.

FIG. 14 is a graph showing the rotational characteristics of a rotor-turbine assembly supported by a gas bearing. The horizontal axis indicates the spinning rate of the rotor-turbine assembly. The vertical axis indicates the amplitude of swings of the rotor-turbine assembly. As shown in FIG. 14, in order to spin the rotor-turbine assembly at high speed, the two resonant points given by the above-described equations must be exceeded. It is necessary to reduce the imbalance in the rotor-turbine assembly to permit it to be spun at high speeds beyond the resonant points.

Therefore, in order to spin the sample tube at high speed in an NMR instrument, the sample tube is required to be filled up with a sample such that the imbalance in the filled sample tube is reduced. However, solid samples filling the sample tube may assume various states such as powdered state, pasty state, and rubber-like state. Also, solid samples assume various forms such as particulate form, filmy form, and block form. For these reasons, it is difficult to fill up a sample tube with a sample with a small amount of imbalance. It has been difficult to spin a sample tube at high speed stably.

SUMMARY OF THE INVENTION

In view of the foregoing, the present invention has been made. According to some aspects of the invention, an NMR sample tube capable of being spun at high speed stably and an NMR spectrometer permitting such high-speed spinning can be offered.

(1) An NMR sample tube associated with the present invention is for use in solid-state NMR spectroscopy and includes a tubular member having openings, spacers disposed inside the tubular member and each having a first surface defining a space filled up with a sample and a second surface located on an opposite side of the first surface, and cover bodies disposed opposite to the second surfaces of the spacers and sealing off the openings in the tubular member.

This NMR sample tube can be filled up with a sample with a small amount of imbalance. In particular, when the sample tube is spun on the bearing of the NMR spectrometer, for example, the NMR sample tube can be filled up with a sample without biasing or deformation of the sample. Accordingly, the sample tube can be stably spun at high speed, for example, beyond the natural vibration frequency at which synchronous vibrations occur.

(2) An NMR sample tube is based on the NMR sample tube as defined in (1) above and further characterized in that a recess may be formed in the first surface of each of the spacers.

This NMR sample tube can be easily filled up with a sample with a reduced amount of imbalance.

(3) An NMR sample tube is based on the NMR sample tube as defined in (2) above and further characterized in that the recess may be conical in shape.

This NMR sample tube can be filled up with a sample easily with a small amount of imbalance.

(4) An NMR sample tube associated with the present invention is based on the NMR sample tube as defined in (2) above and further characterized in that the recess is a paraboloid of revolution in shape and that the spacers may be so positioned that the axis of spinning of the recess is coincident with the central axis of the tubular member.

This NMR sample tube can be filled up with a sample more easily with a reduced amount of imbalance.

(5) An NMR sample tube is based on the NMR sample tube as defined in (1) above and further characterized in that the first surface of each of the spacers may be smooth.

(6) An NMR sample tube is based on the NMR sample tube as defined in (4) above and further characterized in that the spacers may be cylindrical in shape.

(7) An NMR sample tube is based on the NMR sample tube as defined in any one of (1)-(6) above and further characterized in that the spacers are two in number and disposed in the tubular member and that the space may be formed between the first surfaces of the two spacers.

This NMR sample tube can be filled up with a sample more easily with a reduced amount of imbalance.

(8) An NMR sample tube is based on the NMR sample tube as defined in any one of (1)-(7) above and further characterized in that the spacers may be made of an engineering plastic material.

This NMR sample tube permits the spacers to slide smoothly when the spacers are inserted into the tubular member. When the sample tube is spun on the bearing, deformation of the spacers due to spinning can be suppressed. Furthermore, the corrosion resistance of the spacers can be enhanced.

(9) An NMR sample tube is based on the NMR sample tube as defined in any one of (1)-(8) above and further characterized in that the spacers may be made of the same material as the cover bodies.

(10) An NMR sample tube is based on the NMR sample tube as defined in any one of (1)-(9) above and further characterized in that the spacers may be placed in contact with the inner surface of the tubular member.

(11) An NMR sample tube is based on the NMR sample tube as defined in any one of (1)-(10) above and further characterized in that the spacers may be fitted inside the tubular member.

(12) An NMR spectrometer associated with the present invention includes an NMR sample tube as defined in any one of (1)-(11) above.

This NMR spectrometer includes an NMR sample tube associated with the present invention and so the sample tube can be stably spun at high speed, for example, beyond the natural vibration frequency at which synchronous vibrations occur. Therefore, NMR signals can be detected with high sensitivity.

DESCRIPTION OF THE INVENTION

The preferred embodiment of the present invention is hereinafter described in detail with reference to the drawings. It is to be noted that the embodiment described below does not unduly restrict the scope of the present invention delineated by the appended claims and that not all the configurations described below are essential components of the present invention.

1. Configuration of Nuclear Magnetic Resonance Spectrometer

Figure 1:
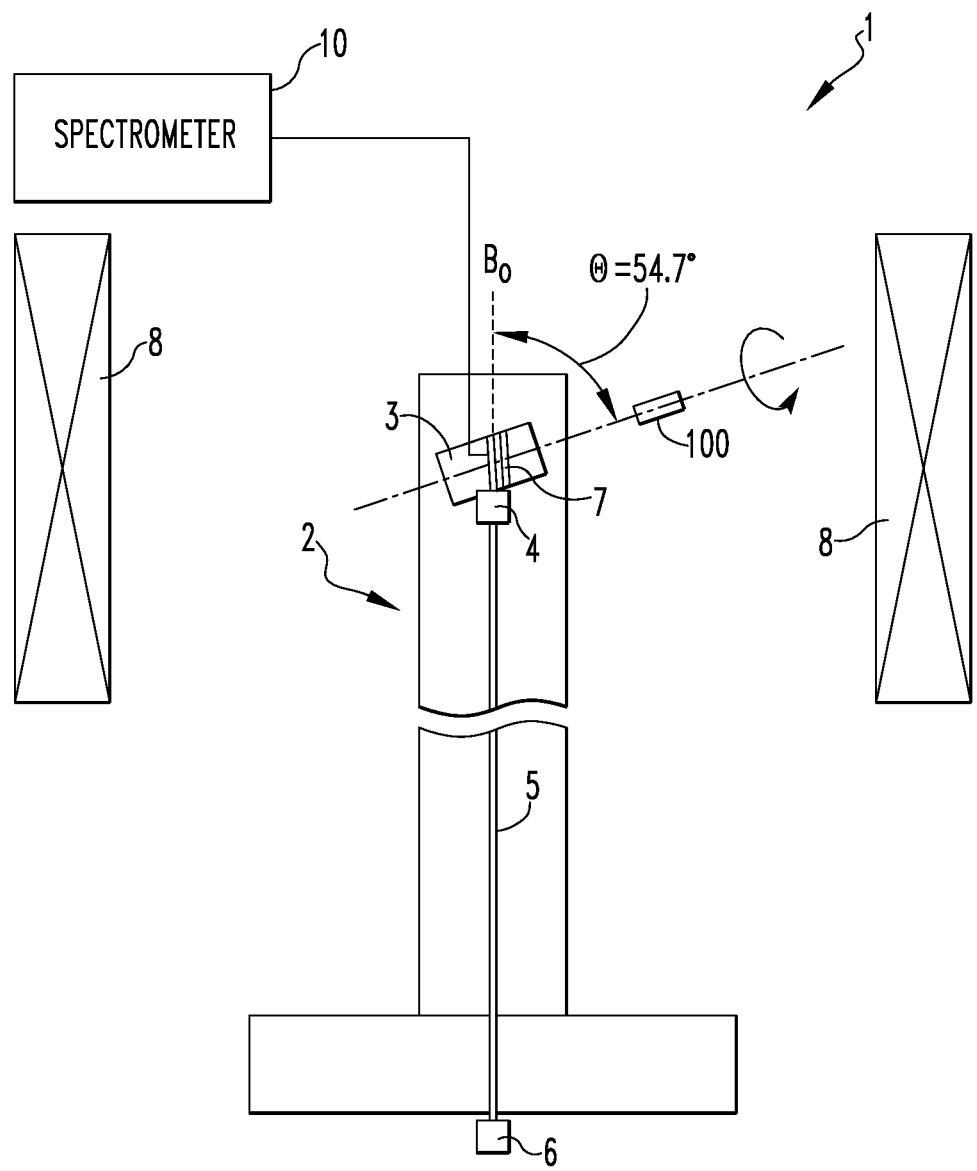
FIG. 1 is a schematic view of an NMR spectrometer according to one embodiment of the present invention.

The configuration of a nuclear magnetic resonance (NMR) spectrometer associated with one embodiment of the present invention is first described by referring to FIG. 1 that schematically depicts the NMR spectrometer, generally indicated by reference numeral 1, associated with the present embodiment.

The NMR spectrometer 1 associated with the present embodiment is capable of solid-state NMR measurements. That is, a sample to be investigated is in solid phase, e.g., powdered state. The state of the sample may be paste-like or rubber-like state. The shape of the sample may be particulate, filmy, or block shape. The NMR spectrometer 1 can obtain NMR spectra of the sample, for example, by MAS NMR, i.e., by spinning a sample tube filled up with the sample at high speed at the magic angle of 54.7° to the static magnetic field so as to remove anisotropic interactions and by extracting chemical shift terms.

Referring still to FIG. 1, the NMR spectrometer 1 includes an NMR sample tube associated with the present invention. It is now assumed that the NMR spectrometer 1 includes a sample tube 100 as one example of the NMR sample tube associated with the present invention.

Furthermore, the NMR spectrometer 1 includes an NMR probe 2, a static magnetic field generator 8, and a spectroscopic section 10.

As shown in FIG. 1, the NMR probe 2 is configured including a bearing 3, a mechanical drive mechanism 4, a shaft 5, a knob 6, and a detection coil 7.

Figure 2:
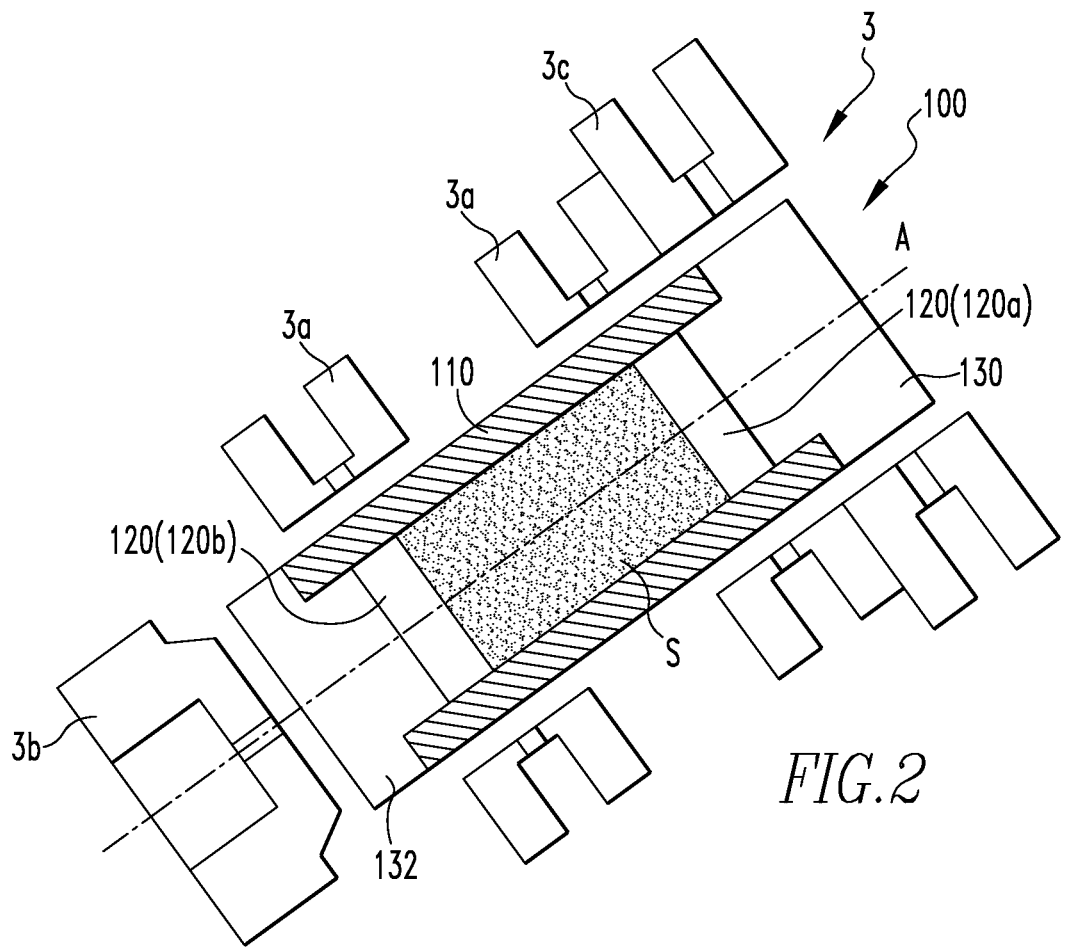
FIG. 2 is a schematic cross section of the bearing of the NMR spectrometer shown in FIG. 1.

FIG. 2 schematically shows the bearing 3 of the NMR spectrometer 1. In FIG. 2, the sample tube 100 is inserted in the bearing 3.

The bearing 3 is configured including radial gas bearings $3a$, a thrust gas bearing $3b$, and nozzles $3c$. The bearing 3 permits the sample tube 100 to be spun about an axis that is tilted at the magic angle θ of 54.7° to the static magnetic field $B_0$.

The radial gas bearings $3a$ supply high-pressure gas from radial directions of the sample tube 100 which are perpendicular to the central axis A of the sample tube 100 to support the sample tube 100. The radial gas bearings $3a$ have a function of determining the radial position of the sample tube 100.

The thrust gas bearing $3b$ supplies gas from the direction of the axis A of the sample tube 100 and supports the sample tube 100. The thrust gas bearing $3b$ has a function of determining the position taken along the axis A of the sample tube 100. The radial gas bearings $3a$ and thrust gas bearing $3b$ cooperate to supply gas, thus floating the sample tube 100. Consequently, the sample tube 100 can be held while out of contact with the bearing 3.

The nozzles $3c$ supply high-pressure gas to a turbine (not shown) mounted in a first cover body 130 of the sample tube 100. As a result, the sample tube 100 spins about its central axis A.

The mechanical drive mechanism 4 is configured including a toothed wheel, and can vary the angular position of the bearing 3. The shaft 5 is a member for manipulating the drive mechanism 4 from the outside. The knob 6 permits a user to gain access such that the magic angle is adjusted. It is possible for the user to operate the drive mechanism 4 via the shaft 5 by manipulating the knob 6. Thus, the angular position of the bearing 3 can be varied. Hence, the angle of the sample tube 100 relative to the static magnetic field $B_0$ can be adjusted.

The detection coil 7 detects an NMR signal emanating from the sample S loaded in the sample tube 100. In particular, the detection coil 7 irradiates nuclei under observation contained in the sample S within the static magnetic field $B_0$ with an RF magnetic field (RF pulses) and detects an NMR signal emanating from the observed nuclei. The spectroscopic section 10 creates an NMR signal based on the NMR signal detected by the detection coil 7.

The static magnetic field generator 8 is made of a superconducting magnet, for example, equipped with superconducting solenoid coils, and generates the static magnetic field $B_0$.

Figure 3:
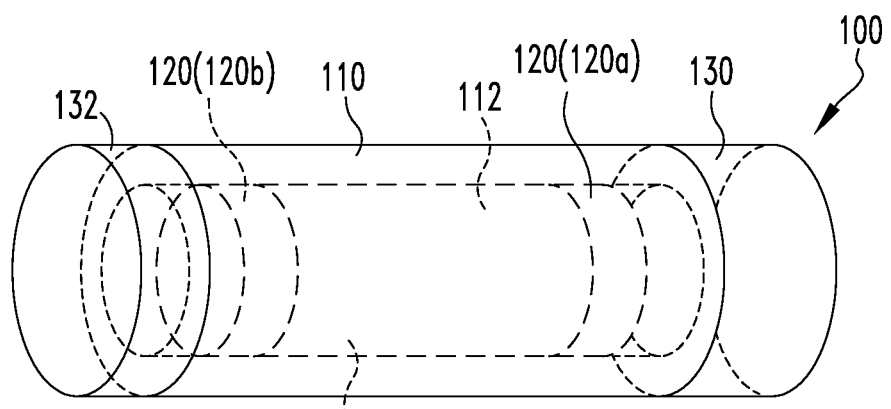
FIG. 3 is a schematic perspective view of a sample tube for use in the NMR spectrometer shown in FIG. 1.
Figure 4:
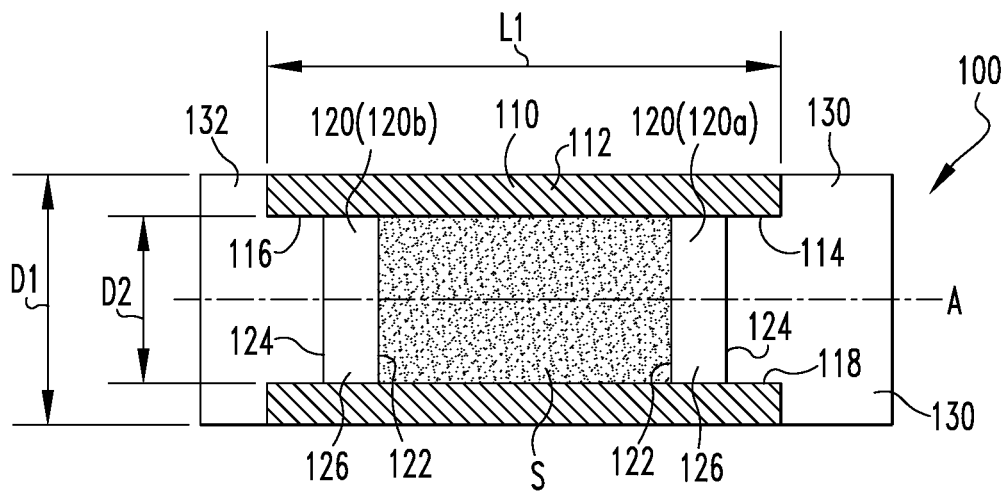
FIG. 4 is a schematic cross section of the sample tube shown in FIG. 3.

The sample tube 100 is next described. FIG. 3 is a schematic perspective view of the sample tube 100. FIG. 4 is a schematic cross-sectional view of the sample tube 100. FIGS. 3 and 4 show the state in which the sample S is sealed in the sample tube 100.

As shown in FIGS. 3 and 4, the sample tube 100 is configured including a tubular member (sleeve) 110, a first spacer 120a, a second spacer 120b (which may be collectively referred to as the spacers 120), and cover bodies 130 and 132.

The tubular member 110 is a cylindrical member and has a hollow cavity that is filled up with the sample S. Furthermore, the spacers 120a and 120b are placed in the tubular member 110. The tubular member 110 has two openings 114 and 116. The tubular member 110 may also be provided with only one opening in an unillustrated manner. The openings 114 and 116 are sealed off by the first cover body 130 and the second cover body 132, respectively. The sample tube 100 is inserted in the bearing 3 of the NMR spectrometer 1 and spins about the central axis A of the tubular member 110 (about the central axis of the sample tube 100). The tubular member 110 is made of a ceramic material such as zirconia or silicon nitride. The length L1 of the tubular member 110 taken along the central axis A is 20 mm, for example. The tubular member 110 has an outside diameter D1, for example, of 8 mm and an inside diameter D2, for example, of 6.4 mm.

The spacers 120 are positioned inside the tubular member 110. In the illustrated example, the first spacer 120a and second spacer 120b are positioned inside the tubular member 110. The spacers 120 are fitted inside the tubular member 110 and placed in contact with the inner surface 118 of the tubular member 110.

Figures 5A, 5B:
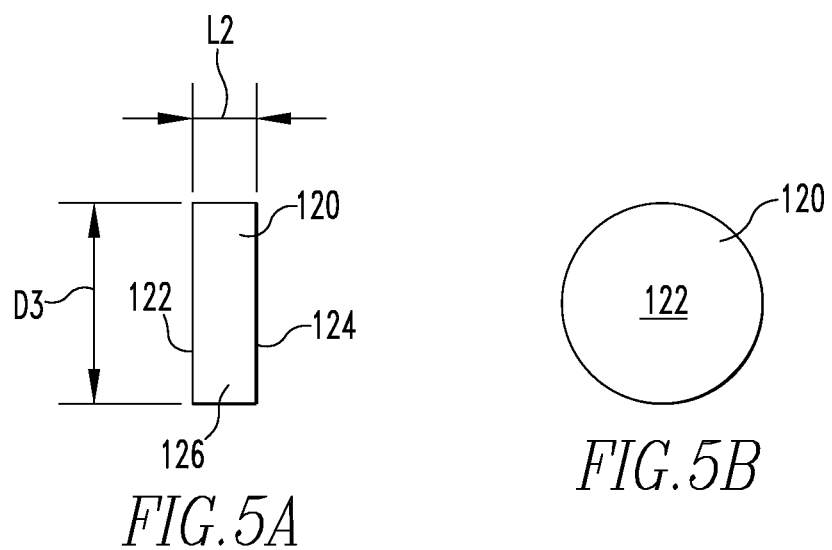
FIG. 5A is a schematic side elevation of one spacer included in the sample tube shown in FIG. 3.
FIG. 5B is a front elevation of the spacer shown in FIG. 5A.

FIG. 5A is a schematic side elevation of one spacer 120, taken from a side of its third surface 126. FIG. 5B is a schematic front elevation of the spacer 120, taken from a side of its first surface 122. Each spacer 120 has the first surface 122, the second surface 124, and the third surface 126 interconnecting the first surface 122 and the second surface 124. For example, each spacer 120 is cylindrical in shape and has a top surface, a bottom surface, and a side surface which are formed by the first surface 122, the second surface 124, and the third surface 126, respectively. Each spacer 120 is positioned in the tubular member 110 such that the central axis of the spacer is coincident with the central axis A of the tubular member 110.

The first surfaces 122 of the spacers 120 define a space 112 that is filled up with the sample S. This space 112 filled with the sample S is formed between the first surface 122 of the first spacer 120a and the first surface 122 of the second spacer 120b. The space 112 is defined by the first surface 122 of the first spacer 120a, the first surface 122 of the second spacer 120b, and the inner surface 118 of the tubular member 110. The first surfaces 122 of the spacers 120 are smooth surfaces.

The second surfaces 124 of the spacers 120 are located on the opposite sides of the respective first surfaces 122. The first cover body 130 is located opposite to the second surface 124 of the first spacer 120a. Furthermore, the second cover body 132 is located opposite to the second surface 124 of the second spacer 120b. The second surfaces 124 of the spacers 120 are smooth surfaces.

The third surface 126 of each spacer 120 interconnects the first surface 122 and the second surface 124. The third surface 126 of the spacer 120 is totally in contact with the inner surface 118 of the tubular member 110.

Each spacer 120 is made of an engineering plastic material such as Teflon™, Diflon™, VESPEL™, TI Polymer™, PEEK™, AURUM™, ULTEM™, or TORLON™. Because the spacers 120 are made of an engineering plastic material, the spacers 120 can be smoothly inserted or pressed into the tubular member 110. Furthermore, when the sample tube 100 spins on the bearing 3, deformation caused by the spinning is suppressed. In addition, the engineering plastic material has good corrosion resistance and so the spacers 120 have good corrosion resistance. Where an NMR signal from Teflon or Diflon is detected, F is detected as a background. Therefore, where the measured sample S does not contain F, the spacers 120 are made of these materials. Where an NMR signal from VESPEL, TI Polymer, PEEK, AURUM, ULTEM, or TORLON is detected, C and H are detected as a background. Therefore, where the investigated sample S contains neither C nor H, the spacers 120 are made of one selected from these materials.

The spacers 120 can be made of a ceramic material such as zirconia. Consequently, the spacers 120 can have good corrosion resistance. Furthermore, the spacers 120 can be made of rubber or metal. The spacers 120 are made of the same material, for example, as the cover bodies 130 and 132.

The length L2 of each spacer 120 taken along its central axis A under the condition where the spacer 120 has been inserted in the tubular member 110 is 2 mm, for example. The spacer 120 has the same diameter D3, for example, as the inside diameter D2 of the tubular member 110.

The first cover body 130 closes off the opening 114 in the tubular member 110. The second cover body 132 closes off the opening 116 in the tubular member 110. The first cover body 130 and the second cover body 132 are located opposite to the second surface 124 of the first spacer 120a and the second surface 124 of the second spacer 120b, respectively. The first cover body 130 is mounted with a press fit in the tubular member 110 and positioned in contact with the second surface 124 of the first spacer 120a. The second cover body 132 is mounted with a press fit in the tubular member 110 and positioned in contact with the second surface 124 of the second spacer 120b. The cover bodies 130 and 132 are made of a material selected, for example, from the materials exemplified as the material of the spacer 120. The cover bodies 130 and 132 can act as stoppers against movement of the spacers 120 through the tubular member 110.

In the sample tube 100, the spacers 120a and 120b define a space 112 filled up with the sample S inside the tubular member 110. The cover bodies 130 and 132 are mounted in the openings 114 and 116, respectively, in the tubular member 110, and the sample S is sealed in the sample tube 100. That is, in the sample tube 100, the first spacer 120a is positioned between the sample S and the first cover body 130. The second spacer 120b is positioned between the sample S and the second cover body 132. The spacers 120a and 120b and cover bodies 130 and 132 are mounted with a press fit, for example, in the tubular member 110.

The sample tube 100 and NMR spectrometer 1 associated with the present embodiment have the following features.

Figure 11:
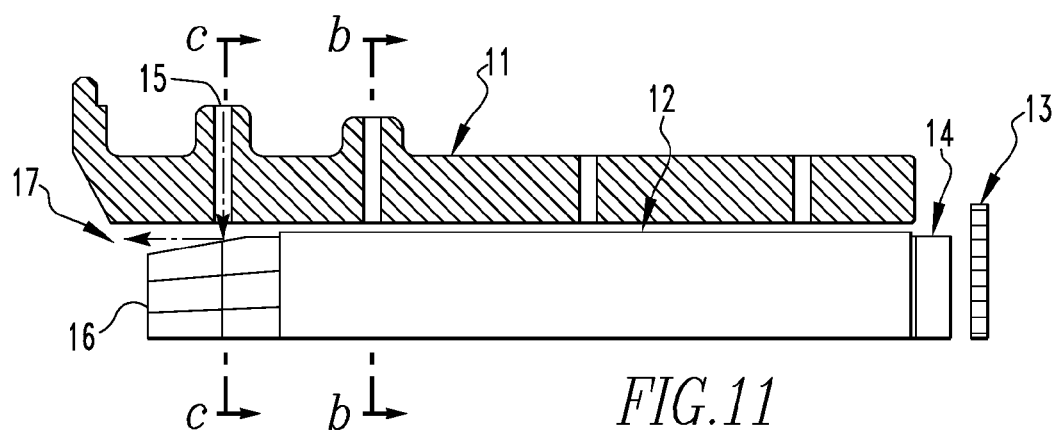
FIGS. 11 and 12 are cross-sectional views taken along lines bb and cc respectively, of a conventional high-speed spinner for use in solid-state NMR spectroscopy.
Figure 12:
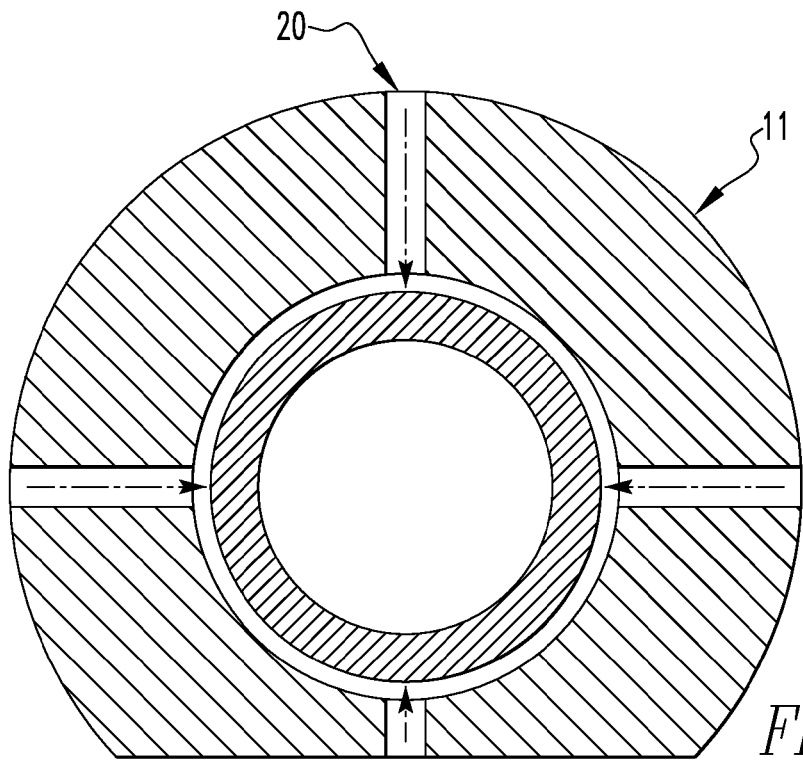
Figure 13:
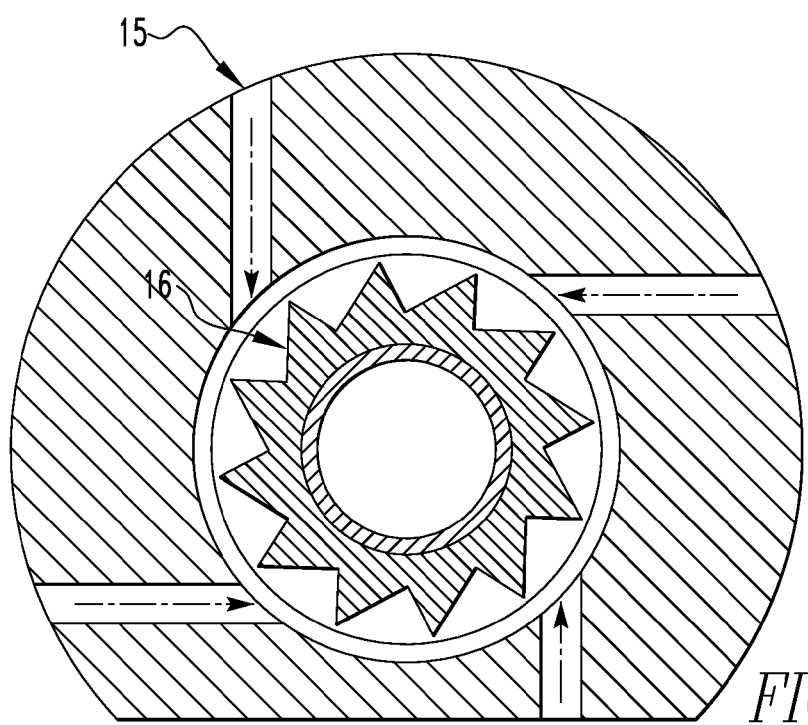
FIG. 13 is another cross-sectional view of the conventional high-speed spinner shown in FIGS. 11 and 12.
Figure 14:
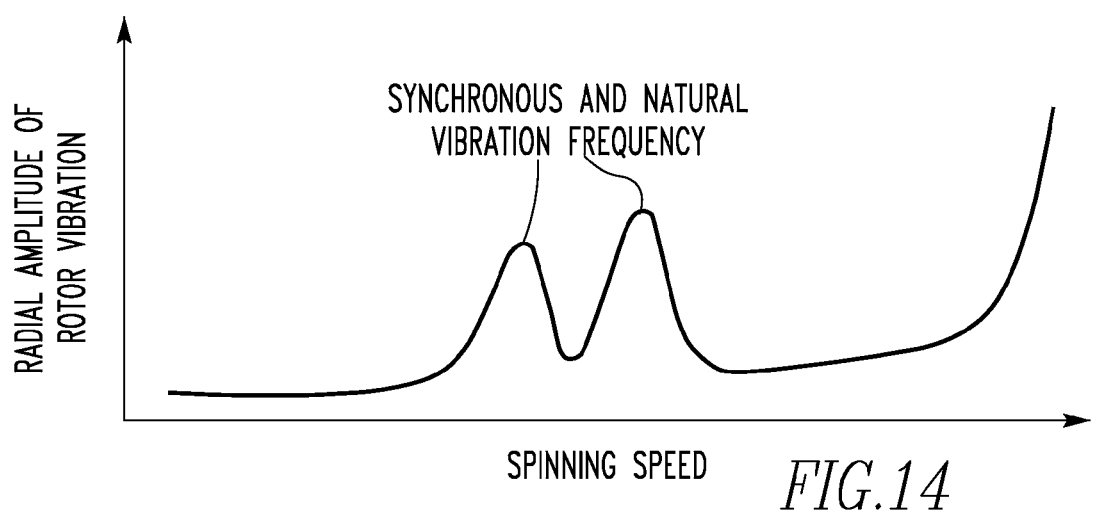
FIG. 14 is a graph showing the rotational characteristics of a rotor-turbine assembly supported by a gas bearing.

The spacers 120 defining the space 112 filled up with the sample S are disposed in the tubular member 110 of the sample tube 100. Consequently, the sample S can be loaded in the sample tube 100 with a reduced amount of imbalance, i.e., the mass distribution about the spinning axis is made more uniform. In particular, when the sample tube 100 is spun on the bearing 3 of the NMR spectrometer 1, for example, the sample tube 100 can be filled up with the sample S in such a way that the sample S is not biased nor deformed. Accordingly, the sample tube can be stably spun at high speed, for example, beyond the natural vibration frequency at which synchronous vibrations occur as shown in FIG. 11.

Figure 6:
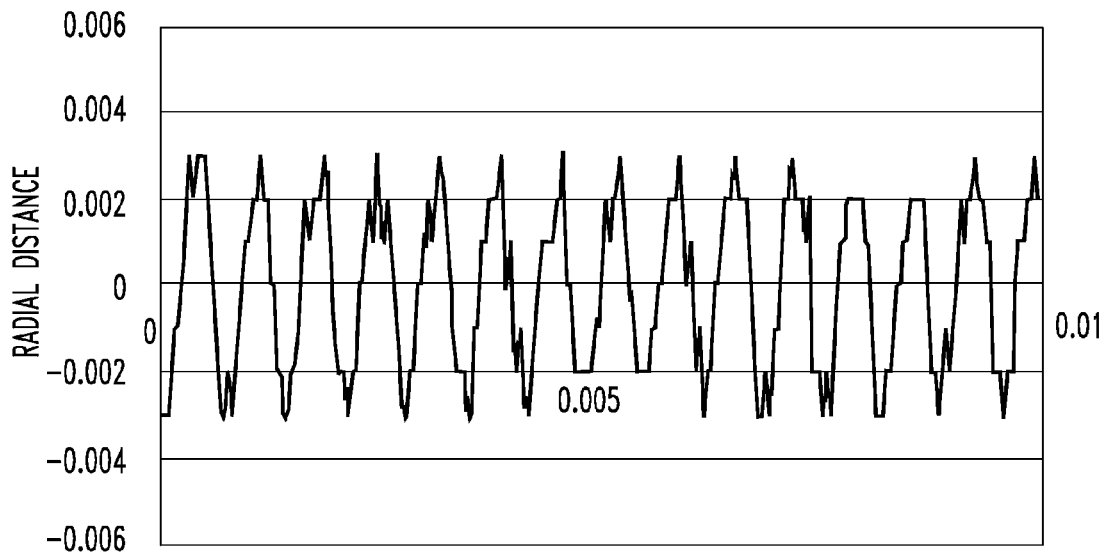
FIG. 6 is a graph showing the results of measurements of the displacement of swinging motion in a case where a sample tube including a tubular member having the spacers therein was spun.
Figure 7:
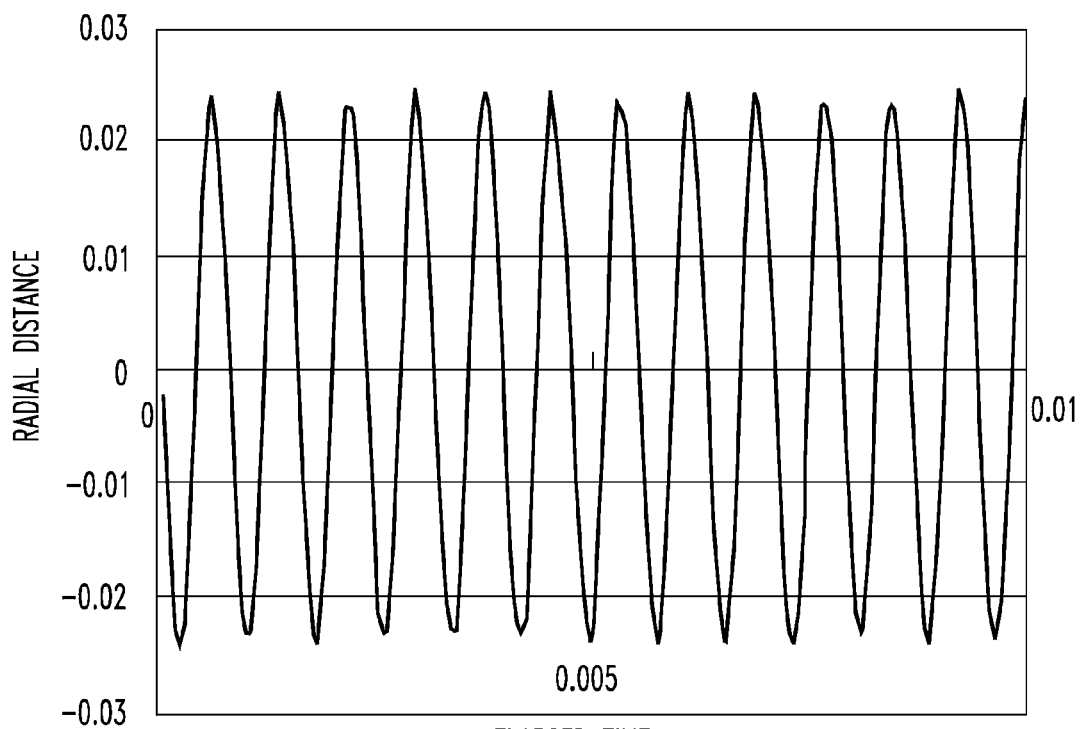
FIG. 7 is a graph similar to FIG. 6 but showing the results of measurements of the displacement in a case where no spacers were present in the tubular member.

FIG. 6 is a graph showing the results of a measurement of the displacement of swinging motion of the sample tube 100 including the tubular member in which the two spacers were disposed when the sample tube was spun. FIG. 7 is a graph showing the result of a measurement of radial distance of a sample tube in which the spacers were not disposed when the sample tube was spun, thus providing a comparative example. In both sample tube 100 and comparative example the length L1 of the tubular member taken along its central axis A is 20 mm. The outside diameter D1 of the tubular member is 8 mm. The inside diameter D2 is 6.4 mm. The length L2 of each spacer is 2 mm. Powdered potassium bromide (KBr) having a specific gravity of 2.75 was used as the sample S. 225.19 μl of sample S was loaded into the sample tube. Both sample tube 100 and comparative example were spun in the vicinity of 1 kHz.

As shown in FIG. 7, in the sample tube of the comparative example, the displacement at the resonant point reached 50 μm. In contrast, as shown in FIG. 6, in the sample tube 100, the displacement at the resonant point was 6 μm. Thus, it has been found that the amount of imbalance can be reduced by placing spacers in the tubular member and that the sample tube can be spun at high speed.

In the sample tube 100, the spacers 120 are made of an engineering plastic material. Therefore, when inserted into the tubular member 110, the spacers 120 slide smoothly. Furthermore, when the sample tube spins on the bearing 3, deformation of the spacers due to the spinning can be suppressed. In addition, the spacers can have improved corrosion resistance.

In the sample tube 100, the spacers 120 are made of the same material as the cover bodies 130 and 132. In consequence, the effects of NMR signals arising from substances other than the sample S can be reduced.

In the sample tube 100, the spacers 120 are placed in contact with the inner surface 118 of the tubular member 110. This can reduce the amount of imbalance of the sample tube 100.

In the sample tube 100, the spacers 120 are fitted inside the tubular member 110. As a consequence, the amount of imbalance of the sample tube 100 can be reduced further.

Since the NMR spectrometer 1 is configured including the sample tube 100, the tube can be spun at high speed stably, for example, beyond the natural vibration frequency at which synchronous vibrations occur as shown in FIG. 11. Therefore, NMR signals can be detected at high sensitivity.

1. Modifications

Modifications of the sample tube of the NMR spectrometer associated with the present embodiment are next described. In the following modifications, those members having the same functions as the corresponding constituent members of the sample tube 100 are indicated by the same reference numerals as in the above description of the sample tube 100 and so their detailed description is omitted below.

Figure 8:
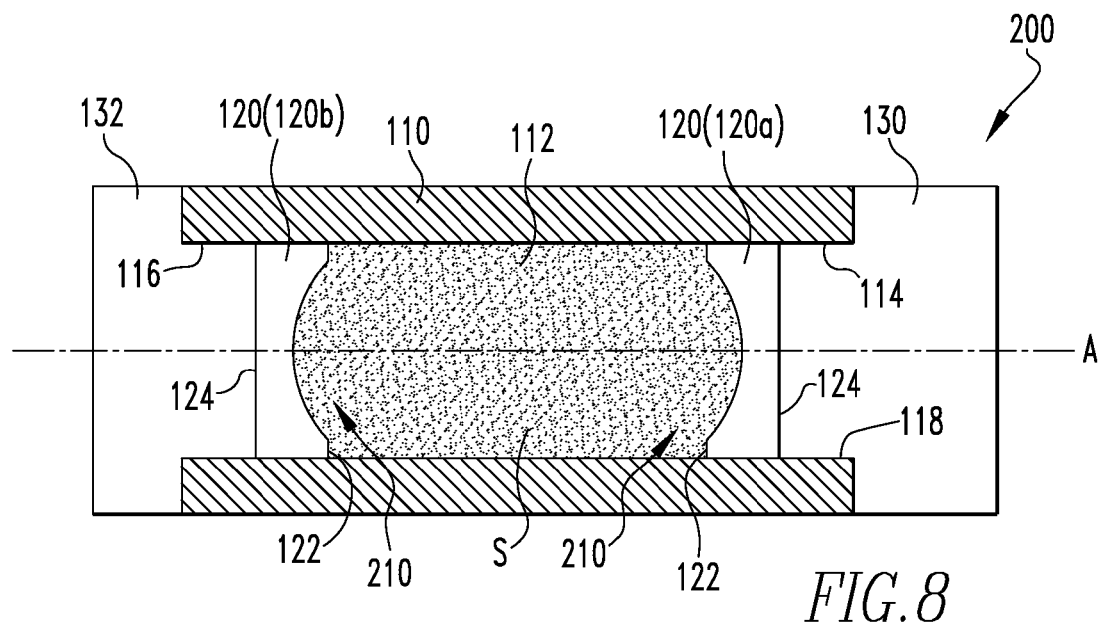
FIG. 8 is a schematic cross section of a sample tube associated with a first modification of the above-described embodiment.
Figures 9A, 9B:
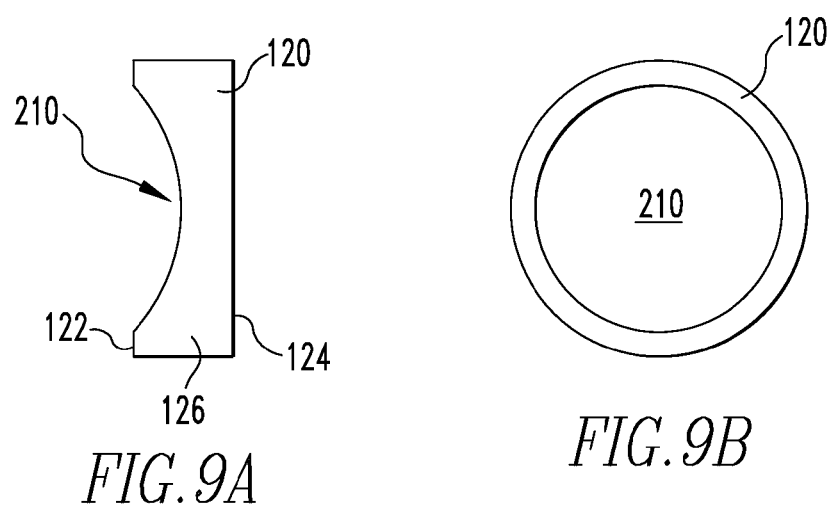
FIG. 9A is a schematic side elevation of one spacer used in the sample tube shown in FIG. 8.
FIG. 9B is a front elevation of the spacer shown in FIG. 9A.

A first modification of the sample tube of the NMR spectrometer associated with the present embodiment is first described. FIG. 8 is a schematic cross section of a sample tube 200, associated with the first modification. FIG. 9A is a schematic view of one spacer 120 of the sample tube 200, as viewed from a side of the third surface 126. FIG. 9B is a schematic front elevation of the spacer 120 shown in FIG. 9A, as viewed from a side of the first surface 122.

As shown in FIGS. 8, 9A, and 9B, the first surface 122 of the spacer 120 of the sample tube 200 has a recess 210. In the illustrated example, the recess 210 is formed in a part of the first surface 122. Alternatively, the recess 210 may be formed over the whole first surface 122. That is, the whole first surface 122 may be a recessed surface.

The shape of the recess 210 is conical or a paraboloid of revolution, for example. That is, the region of the first surface 122 defining the recess 210 is a paraboloid of revolution, for example. A paraboloid of revolution is a quadratic curve obtained by rotating a parabola about its axis of symmetry. As shown in FIG. 8, the spacer 120 is so placed that the axis of rotation of the recess 210 (paraboloid of revolution) is coincident with the central axis A of the tubular member 110. The shape of the recess 210 may also be conical.

Because the recess 210 is formed in the first surface 122 of the sample tube 200, it is easy to load the sample S into the sample tube 100 such that only a small amount of imbalance occurs.

Furthermore, because the recess 210 of the sample tube 200 may be conical in shape, it is easier to load the sample S into the sample tube 100 such that only a small amount of imbalance occurs.

In the sample tube 200, the shape of the recess 210 may be a paraboloid of revolution. The axis of spinning of the recess 210 (paraboloid of revolution) is brought into coincidence with the central axis A of the tubular member 110. Consequently, it is easier to load the sample S into the sample tube 100 so as to suppress the imbalance.

Figure 10:
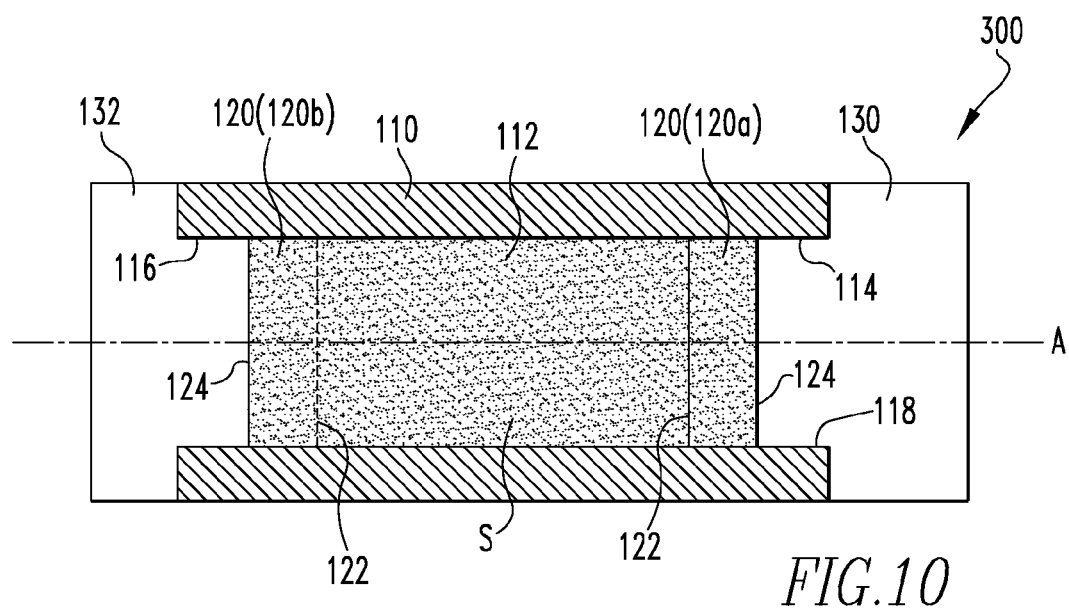
FIG. 10 is a schematic cross-sectional view of a sample tube associated with a second modification of the above-described embodiment.

A second modification of the sample tube of the present embodiment is next described. FIG. 10 is a schematic cross section of a sample tube 300, associated with the second modification of the present embodiment.

In the above example of the sample tube 100, the two spacers 120a and 120b are disposed inside the tubular member 110 as shown in FIG. 4. The space 112 filled up with the sample S is formed between the first surface 122 of the first spacer 120a and the first surface 122 of the second spacer 120b.

In contrast, in the sample tube 300, the single spacer 120 is disposed inside the tubular member 110. Therefore, the space 112 filled up with the sample S is formed between the first surface 122 of the spacer 120 and the second cover body 132. In the illustrated example, only the first spacer 120a is positioned within the tubular member 110. Alternatively, only the second spacer 120b may be positioned within the tubular member 110.

In the sample tube 300, the sample S is loaded in the tubular member 110. The cover bodies 130 and 132 are mounted in the openings 114 and 116, respectively, of the tubular member 110. Thus, the sample S is sealed in. In particular, the second cover body 132 is first mounted in the opening 116 of the tubular member 110. Then, the sample S is loaded from the opening 114 of the tubular member 110. The spacer 120 is then mounted with a press fit in the tubular member 110. The first cover body 130 is mounted in the opening 114.

In the sample tube 300, the spacer 120 defining the space 112 filled up with the sample S is disposed inside the tubular member 110 in the same way as for the sample tube 100. Therefore, the sample tube 100 can be filled up with the sample S such that the amount of imbalance is suppressed. Hence, the sample tube can be stably spun at high speed, for example, beyond the natural vibration frequency at which synchronous vibrations are induced as shown in FIG. 11.

It is to be understood that the above-described embodiment and modifications are merely exemplary and that the invention is not restricted thereby. For instance, the embodiment and modifications may be appropriately combined.

The invention embraces configurations (e.g., configurations identical in function, method, and results or configurations identical in purpose and effects) substantially identical with the configurations described in the above embodiment. Furthermore, the invention embraces configurations having those non-essential portions of the configurations described in the embodiment which have been replaced by other portions. In addition, the invention embraces configurations yielding the same advantageous effects or configurations capable of achieving the same purpose as the configurations described in the embodiment. Further, the invention embraces configurations consisting of the configurations described in the above embodiment to which well-known techniques are attached.

Having thus described my invention with the detail and particularity required by the Patent Laws, what is desired protected by Letters Patent is set forth in the following claims.

The invention claimed is:

1. An NMR sample tube for use in solid-state NMR spectroscopy, said NMR sample tube comprising:
   a tubular member having an axial bore with openings at each axial end;
   solid disc-like spacers disposed inside the bore of the tubular member and each spacer having a first surface cooperating with the axial bore to define a space filled up with a sample without biasing or deformation of the sample and a second surface located on an opposite side of the spacer from the first surface; and cover bodies mounted in the openings at each axial end of the bore disposed opposite to and abutting the second surfaces of the spacers and sealing off the openings in the tubular member.

2. An NMR sample tube as set forth in claim 1, wherein a recess is formed in the first surface of each of the spacers.

3. An NMR sample tube as set forth in claim 2, wherein said recess is conical in shape.

4. An NMR sample tube as set forth in claim 2, wherein said recess is a paraboloid of revolution in shape, and wherein said spacers are disposed such that an axis of spinning of the recess is coincident with a central axis of said tubular member.

5. An NMR sample tube as set forth in claim 1, wherein said first surface of each of the spacers is smooth.

6. An NMR sample tube as set forth in claim 4, wherein said spacers are cylindrical in shape.

7. An NMR sample tube as set forth in claim 1, wherein said spacers are two in number and disposed inside said tubular member, and wherein said space is formed between said first surfaces of the two spacers.

8. An NMR sample tube as set forth in claim 1, wherein said spacers are made of an engineering plastic material.

9. An NMR sample tube as set forth in claim 1, wherein said spacers are made of the same material as said cover bodies.

10. An NMR sample tube as set forth in claim 1, wherein said spacers are placed in contact with the inner surface of said tubular member.

11. An NMR sample tube as set forth in claim 1, wherein said spacers are fitted inside said tubular member.

12. An NMR spectrometer including an NMR sample tube as set forth in claim 1.

* * * * *